(12) United States Patent
Nakashima et al.

(10) Patent No.: US 8,298,437 B2
(45) Date of Patent: Oct. 30, 2012

(54) ALKALI ETCHING LIQUID FOR SILICON WAFER AND ETCHING METHOD USING SAME

(75) Inventors: Takahisa Nakashima, Karatsu (JP); Makoto Takemura, Imari (JP); Yasuyuki Hashimoto, Imari (JP)

(73) Assignee: Sumco Corporation, Tokyo (JP)

(\*) Notice: Subject to any disclaimer, the term of this patent is extended or adjusted under 35 U.S.C. 154(b) by 265 days.

(21) Appl. No.: 12/575,728

(22) Filed: Oct. 8, 2009

(65) Prior Publication Data

US 2010/0025624 A1 Feb. 4, 2010

Related U.S. Application Data

(62) Division of application No. 11/296,254, filed on Dec. 8, 2005, now Pat. No. 7,618,897.

(30) Foreign Application Priority Data

Dec. 10, 2004 (JP) ................................. 2004-357521

(51) Int. Cl.
*C09K 13/00* (2006.01)

(52) U.S. Cl. ..................... 252/79.1; 438/753; 438/745

(58) Field of Classification Search .................. None
See application file for complete search history.

(56) References Cited

U.S. PATENT DOCUMENTS

| | | | |
|---|---|---|---|
| 3,639,815 A | 2/1972 | Ernick et al. | |
| 3,909,119 A | 9/1975 | Wolley | |
| 5,885,362 A * | 3/1999 | Morinaga et al. | 134/2 |
| 6,110,839 A * | 8/2000 | Nakano et al. | 438/753 |
| 6,284,384 B1 | 9/2001 | Wilson et al. | |
| 6,319,845 B1 | 11/2001 | Uchiyama et al. | |
| 6,362,106 B1 | 3/2002 | Kaufman et al. | |
| 6,586,336 B2 | 7/2003 | Jeong | |
| 7,323,421 B2 * | 1/2008 | Stinson et al. | 438/749 |
| 2002/0151252 A1 | 10/2002 | Kawase et al. | |
| 2003/0008504 A1 | 1/2003 | Miyazaki | |
| 2005/0204639 A1 | 9/2005 | Ishihara | |

\* cited by examiner

*Primary Examiner* — Binh X Tran
*Assistant Examiner* — David Cathey, Jr.
(74) *Attorney, Agent, or Firm* — Pillsbury Winthrop Shaw Pittman, LLP

(57) ABSTRACT

An alkali etching liquid for a silicon wafer that includes an aqueous solution of potassium hydroxide, and from 0.1 g/L to 0.5 g/L of diethylene triamine pentaacetic acid. Furthermore, the Fe concentration of the aqueous solution of potassium hydroxide is no more than 50 ppb. An etching method that including a step of etching a silicon wafer with a resistivity of no more than 1 Ω·cm using the etching liquid.

2 Claims, 3 Drawing Sheets

ALKALI ETCHING LIQUID FOR SILICON WAFER AND ETCHING METHOD USING SAME

The present application is a divisional of U.S. patent application Ser. No. 11/296,254, filed on Dec. 8, 2005 now U.S. Pat. No. 7,618,897, now allowed, which claims priority to Japanese Patent Application No. 2004-0357521, filed Dec. 10, 2004, the entire contents of each of the foregoing applications herein fully incorporated by reference.

BACKGROUND OF THE INVENTION

1. Field of the Invention

The present invention relates to an alkali etching liquid which exhibits a Ni contamination reduction effect and a Cu contamination prevention effect even during the alkali etching of silicon wafers of low resistivity, and also relates to an etching method using such an etching liquid.

2. Description of Related Art

In a typical silicon wafer production, as shown in FIG. 5, a silicon single crystal ingot 1 that has been drawn using an apparatus for pulling single crystal is cut into blocks of a specified size, further grinding of the outer diameter is performed, and the resulting ingot block is then subjected to a water cutting (slicing) step 2, thereby forming thin, disc-like wafers. An internal diameter saw, band saw, or wire saw or the like is used in this slicing step. Subsequently, each thin, disc-like wafer is washed, and the outer peripheral edges of the wafer are subjected to a beveling step 3, thereby preventing particles, which are caused by cracking or chipping at the edges of the wafer, and also preventing the crown phenomenon, wherein abnormal growth can occur at the peripheral portions of the wafer during epitaxial growth on the wafer. The wafer is then subjected to a mechanical lapping step 4 to smooth the wafer surface, thereby grinding down the irregularities on the wafer surface generated by the slicing step 2, and improving the surface smoothness and wafer parallelism. By subsequently conducting a wafer etching step 5, affected layers of the various process materials formed on the wafer surface during the mechanical treatment processes such as the block cutting, outer diameter grinding, slicing and lapping steps can be removed. Subsequently, the etched wafer surface is polished in a wafer surface polishing step 6, and then washed in a washing step 7 to remove any polishing agents or contaminants that have adhered to the polished wafer surface, thereby yielding a silicon wafer 8 with a high degree of smoothness. Depending on the targeted application, a portion of these steps may be either replaced or repeated a plurality of times, and other steps such as heat treatment and grinding steps may be added or substituted to achieve the desired process.

A silicon wafer that has passed through mechanical treatment processes such as block cutting, outer diameter grinding, slicing and lapping contains a damage layer, also known as an affected layer. This affected layer can cause a variety of problems, including inducing crystal defects such as slip dislocation in subsequent device production processes, lowering the mechanical strength of the wafer, and causing undesirable effects on the electrical properties of the wafer, and must consequently be completely removed. An etching treatment is normally used for removing this affected layer. Suitable etching treatments include acid etching using an acid etching liquid of mixed acid or the like, and alkali etching using an alkali etching liquid of NaOH or the like. Acid etching has a faster etching rate, meaning uniform etching of the wafer surface is more difficult, and as a result, it tends to be prone to a deterioration in the degree of smoothness of the lapped wafer. Accordingly, alkali etching, which enables more uniform etching and does not impair the degree of smoothness of the wafer, is more widely used.

However, the electronic industrial grade alkali solutions used in this type of alkali etching contains between several dozen ppb and several ppm of metal impurities. Examples of these metal impurities contained within the alkali solutions include nickel, chrome, iron, and copper, and of these, nickel, chrome and iron from the stainless steel materials used in the production of the alkali solutions exist in the highest concentrations. If an alkali solution containing these types of metal impurities is used, as is, as the alkali treatment liquid within a wafer etching step, then during etching, metal ions from the metal impurities may adhere to the wafer surface or diffuse into the wafer interior, causing a deterioration in the wafer quality, which can cause a marked deterioration in the properties of the semiconductor device formed using the wafer. One possible solution for preventing deterioration in the wafer quality caused by the alkali etching liquid is to use a high purity alkali solution. However, commercially available high purity alkali solutions are limited to the extremely expensive analytical grade alkali solutions, and the use of such solutions for industrial purposes is completely impractical from a cost perspective.

Examples of methods that have been disclosed for resolving the above problems include alkali solution purification methods, in which metallic silicon or a silicon compound is dissolved in the alkali solution, with the resulting reaction product then effecting a deionization of the metal ions within the alkali solution, or alternatively, in which hydrogen gas is dissolved in the alkali solution, thereby effecting a deionization of the metal ions within the alkali solution, as well as semiconductor wafer etching methods in which an alkali solution purification treatment is conducted by deionizing the metal ions within the alkali solution, and the resulting purified alkali solution is then used for etching a silicon wafer (for example, see patent reference 1). Furthermore, an alkali solution purification method in which a reducing agent with a more basic oxidation potential than the reversible potential of the metal ions within the alkali solution is dissolved in the alkali solution, thereby effecting a deionization of the metal ions within the alkali solution, as well as a semiconductor wafer etching method in which a metal ion deionization treatment is conducted by dissolving a reducing agent with a more basic oxidation potential than the reversible potential of the metal ions within the alkali solution in the alkali solution, and the resulting deionized alkali solution is then used for etching a silicon wafer have also been disclosed (for example, see patent reference 2). By using the methods of the patent references 1 and 2, the metal ions within an alkali solution can be significantly reduced and low cost using a simple operation. Furthermore, by conducting etching using an alkali solution with a significantly lowered metal ion concentration, the degree of metal contamination of the silicon wafer caused by the etching process can be dramatically reduced, enabling both deterioration in the wafer quality and deterioration in the properties of the semiconductor device to be effectively suppressed.

In addition, an etching liquid for a semiconductor material that is prepared by immersing stainless steel in an aqueous alkali solution for at least 10 hours has also been disclosed (for example, see patent reference 3). The etching liquid disclosed in the patent reference 3 is able to effectively prevent metal contamination of semiconductor silicon wafers.

Patent Reference 1: Japanese Unexamined Patent Application, First Publication No. Hei 09-129624 (claim 1, claim 6, claim 9, and paragraph [0049])

Patent Reference 2: Japanese Unexamined Patent Application, First Publication No. Hei 10-310883 (claim 1, claim 5, and paragraph [0039])

Patent Reference 3: Japanese Unexamined Patent Application, First Publication No. 2001-250807 (claim 1, and paragraph [0033])

However, even using the etching methods and etching liquids disclosed in the above patent references 1 to 3, the reduction in the quantity of metal contaminants that diffuse into the interior of the wafer during etching is still not entirely satisfactory, and further improvements are desirable. Reductions are particularly sought in the level of Ni contamination and Cu contamination that diffuses into the interior of a silicon wafer with a resistivity of no more than 1 Ω·cm following alkali etching.

An object of the present invention is to provide an alkali etching liquid for a silicon wafer, and an etching method that uses such an etching liquid, which enable Ni contamination of the silicon wafer caused by the alkali etching to be reduced at low cost.

Another object of the present invention is to provide an alkali etching liquid for a silicon wafer, and an etching method that uses such an etching liquid, which enable Cu contamination of the silicon wafer caused by the alkali etching to be prevented, and also enable a further reduction in the Ni contamination.

SUMMARY OF THE INVENTION

A first aspect of the present invention is an alkali etching liquid for a silicon wafer that contains an aqueous solution of potassium hydroxide (hereafter abbreviated as KOH), and from 0.1 g/L to 0.5 g/L of diethylene triamine pentaacetic acid (hereafter abbreviated as DTPA).

In this first aspect of the present invention, an aqueous solution of KOH is used as the primary component, and DTPA is then added to this KOH aqueous solution in a quantity within the range described above to form the alkali etching liquid. This alkali etching liquid contains between several dozen ppb and several hundred ppb of Ni, which is incorporated as an unavoidable impurity within the electronic industrial grade KOH aqueous solution used for etching semiconductor wafers, but this Ni can be adsorbed to the DTPA by bonding to the hydroxyl groups and amino groups of the DTPA. As a result, when the alkali etching liquid of the first aspect of the present invention is used for etching a silicon wafer or the like, the Ni ions within the KOH aqueous solution don't remain at the wafer surface without diffusing into the interior of the wafer, enabling a significant reduction in the Ni contamination of the silicon wafer caused by the alkali etching treatment.

A second aspect of the present invention is an alkali etching liquid according to the first aspect, wherein the Fe concentration of the KOH aqueous solution is no more than 50 ppb.

In this second aspect of the present invention, by conducting etching of a silicon wafer or the like using an etching liquid in which the Fe concentration within the KOH aqueous solution has been reduced to a level within the above range, Cu contamination of the silicon wafer can be prevented, and a further reduction in the level of Ni contamination can also be achieved.

A third aspect of the present invention is an alkali etching liquid according to the second aspect, wherein the Fe concentration within the KOH aqueous solution is within a range from 5 ppb to 30 ppb.

A fourth aspect of the present invention is an alkali etching liquid according to the first aspect, wherein the quantity added of diethylene triamine pentaacetic acid is within a range from 0.1 g/L to 0.3 g/L.

A fifth aspect of the present invention is an etching method that includes a step of etching a silicon wafer with a resistivity of no more than 1 Ω·cm using an alkali etching liquid according to any one of the first through fourth aspects.

In this fifth aspect of the present invention, even in the case of a silicon wafer with a resistivity of 1 Ω·cm, which is particularly prone to the diffusion of Ni into the wafer interior, by using an alkali etching liquid according to any one of the first through fourth aspects, the Ni ions and Cu ions within the KOH aqueous solution don't remain at the wafer surface, meaning diffusion of these ions into the wafer interior can be suppressed dramatically, and enabling a reduction in the Ni contamination of the silicon wafer, and prevention of the Cu contamination caused by the alkali etching.

A sixth aspect of the present invention is an etching method according to the fifth aspect, wherein the resistivity of the silicon wafer is within a range from 0.005 Ω·cm to 0.1 Ω·cm.

An alkali etching liquid for silicon wafers according to the present invention uses a KOH aqueous solution as the primary component, and includes a predetermined quantity of DTPA added to this KOH aqueous solution. The electronic industrial grade KOH aqueous solution used for etching semiconductor wafers contains between several dozen ppb and several hundred ppb of Ni as an unavoidable impurity, but this Ni is adsorbed to the DTPA, meaning when the alkali etching liquid of the present invention is used for etching a silicon wafer or the like, the Ni ions within the KOH aqueous solution don't remain at the wafer surface, meaning diffusion of these ions into the wafer interior can be suppressed dramatically, and enabling a reduction in the Ni contamination of the silicon wafer caused by the alkali etching treatment. Furthermore, by conducting etching of a silicon wafer or the like using an alkali etching liquid in which the Fe concentration within the KOH aqueous solution has been reduced to a level within the range described above, Cu contamination of the silicon wafer can be prevented, and a further reduction in the level of Ni contamination can also be achieved. Moreover, according to an etching method of the present invention, even in the case of a silicon wafer with a resistivity of 1 Ω·cm, which is particularly prone to the diffusion of Ni into the wafer interior, by using an alkali etching liquid according to the present invention, the Ni ions and Cu ions within the KOH aqueous solution don't remain at the wafer surface, meaning diffusion of these ions into the wafer interior can be suppressed dramatically, and enabling a reduction in the Ni contamination of the silicon wafer, and prevention of the Cu contamination caused by the alkali etching.

DETAILED DESCRIPTION OF THE INVENTION

Figure 1:
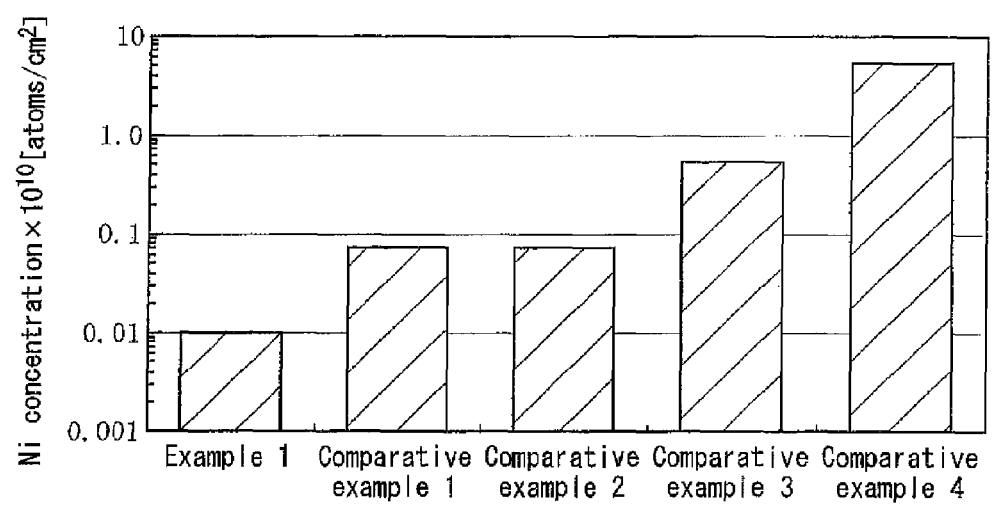
FIG. 1 is a graph showing the Ni contamination concentration at the surface of silicon wafers that have been subjected to etching using alkali etching liquids of an example 1 and comparative examples 1 to 3.

As follows is a description of preferred embodiments of the present invention.

An alkali etching liquid for a silicon wafer according to the present invention contains a KOH aqueous solution, and from 0.1 g/L to 0.5 g/L of DTPA added in the KOH aqueous solution. The KOH aqueous solution is used as the primary component, and the DTPA is then added to this KOH aqueous solution in a quantity within the range described above to form the alkali etching liquid, and although this alkali etching liquid contains between several dozen ppb and several hundred ppb of Ni, which is incorporated as an unavoidable impurity within the electronic industrial grade KOH aqueous solution used for etching semiconductor wafers, this Ni can be adsorbed to the DTPA by bonding to the hydroxyl groups and amino groups of the DTPA. As a result, when the alkali etching liquid of the present invention is used for etching a silicon wafer or the like, the Ni ions within the KOH aqueous solution don't remain at the wafer surface without diffusing into the interior of the wafer, enabling a significant reduction in the Ni contamination of the silicon wafer caused by the alkali etching treatment. The reason that the quantity of added DTPA was set within the range from 0.1 g/L to 0.5 g/L is that quantities of less than 0.1 g/L are unable to provide a satisfactory Ni contamination reduction effect, whereas no additional effect is achieved once the quantity exceeds 0.5 g/L. Particularly preferred quantities for the DTPA addition are within a range from 0.1 g/L to 0.3 g/L.

Furthermore, in an alkali etching liquid of the present invention, although the addition of DTPA prevents Ni ion diffusion, there is also a tendency for the DTPA addition to cause diffusion of Cu from the wafer surface into the wafer interior. Accordingly, in an alkali etching liquid of the present invention, the Fe concentration of the KOH aqueous solution is preferably restricted to no more than 50 ppb. By conducting etching of a silicon wafer or the like using an etching liquid in which the Fe concentration within the KOH aqueous solution has been reduced to a level within this range, Cu contamination of the silicon wafer can be prevented, and a further reduction in the level of Ni contamination can also be achieved. Fe concentration levels within a range from 5 ppb to 30 ppb are particularly desirable.

An etching method of the present invention includes a step of etching a silicon wafer with a resistivity of no more than 1 $\Omega \cdot cm$ using an aforementioned alkali etching liquid according to the present invention. Even in the case of a silicon wafer with a resistivity of 1 $\Omega \cdot cm$, which is particularly prone to the diffusion of Ni into the wafer interior, by using an alkali etching liquid according to the present invention, the Ni ions and Cu ions within the KOH aqueous solution don't remain at the wafer surface, meaning diffusion of these ions into the wafer interior can be suppressed dramatically, enabling a reduction in the Ni contamination of the silicon wafer, and prevention of the Cu contamination caused by the alkali etching. Conducting etching of silicon wafers with a resistivity within a range from 0.005 $\Omega \cdot cm$ to 0.1 $\Omega \cdot cm$ provides a particularly superior Ni contamination reduction effect. An alkali etching liquid of the present invention enables a reduction in Ni contamination caused by the alkali etching, and prevention of Cu contamination, regardless of the concentration of the KOH aqueous solution or the temperature of the etching liquid during etching.

EXAMPLES

As follows is a more detailed description of the present invention based on a series of examples and comparative examples.

Example 1

A 40% by weight aqueous solution of KOH was prepared. This KOH aqueous solution contained 10 ppb of Ni. DTPA was added to, and mixed into this KOH aqueous solution in a quantity equivalent to 0.1 g/L, thereby forming an alkali etching liquid.

Comparative Example 1

With the exception of adding phosphonic acid to the KOH aqueous solution instead of the DTPA, an alkali etching liquid was prepared in the same manner as the example 1.

Comparative Example 2

With the exception of adding triethylene tetramine-N,N,N',N'',N''',N'''-hexaacetic acid (hereafter abbreviated as TTHA) to the KOH aqueous solution instead of the DTPA, an alkali etching liquid was prepared in the same manner as the example 1.

Comparative Example 3

With the exception of altering the quantity of DTPA added to 0.02 g/L, an alkali etching liquid was prepared in the same manner as the example 1.

Comparative Example 4

The KOH aqueous solution prepared in the example 1 was used, as is, as an alkali etching liquid. In other words, no DTPA was added to this alkali etching liquid.

<Comparative Experiment 1>

Figure 2:
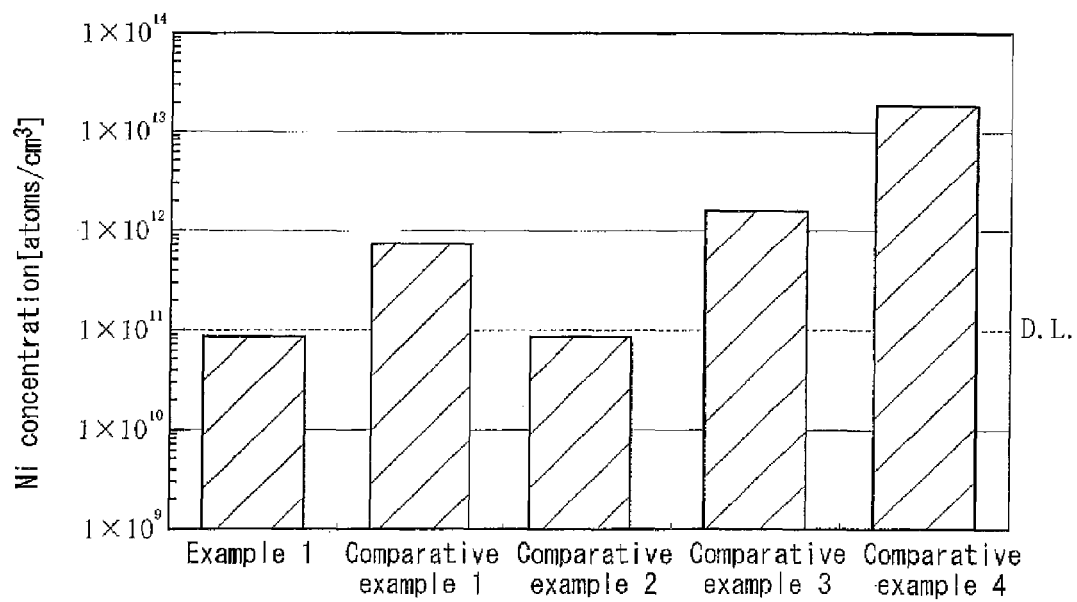
FIG. 2 is a graph showing the Ni contamination concentration within the interior of silicon wafers that have been subjected to etching using the alkali etching liquids of the example 1 and the comparative examples 1 to 3.

Eight lapped silicon wafers with a resistivity within a range from 0.005 to 0.010 $\Omega \cdot cm$ were prepared, and each of the alkali etching liquids prepared in the example 1 and the comparative examples 1 through 3 was then used to conduct etching of two of these silicon wafers. Subsequently, using the methods described below, the Ni contamination concentration at the wafer surface, and the Ni contamination concentration within the wafer interior were measured for each of the etched silicon wafers. FIG. 1 shows the results of analyzing the Ni contamination concentration at the wafer surface, and FIG. 2 shows the results of analyzing the Ni contamination concentration within the wafer interior. In FIG. 2, the label "D.L." represents the detection limit of the analysis apparatus.

(1) Method of Measuring Metal Contamination Concentration at the Wafer Surface

First, the silicon wafer was held above a beaker containing an HF solution, with a certain separation distance, using a holding device such as a pair of tweezers or the like, thereby decomposing the wafer surface by exposure to the HF vapor. Subsequently, the wafer was mounted on a plate, and the wafer surface was irradiated with an infrared lamp, thereby removing the silicon component and water component present at the wafer surface. A mixed solution of HCl and $H_2O_2$ was then prepared, and droplets of this mixed solution were dripped onto the wafer surface until the droplets covered the entire wafer surface, thereby dissolving any residual metal impurities in the solution (droplets), and recovering (yielding) a solution (droplets) containing the dissolved metal impurities. This recovered solution was then measured using an ICP-MS analysis apparatus (an inductively coupled plasma-mass spectrometry apparatus), thus enabling a quantitative analysis of the Ni content.

(2) Method of Measuring Metal Impurity Concentration within Wafer Interior

First, a reaction vessel containing an acid-resistant container and a lid, with a mounting stage provided inside the vessel, was prepared. The mounting stage included a stand portion and a table, and a flange was provided around the majority of the outside edge of the table. A decomposition solution produced by mixing uniformly together predetermined quantities of HF, $HNO_3$ and $H_2SO_4$ was also prepared. Subsequently, the decomposition solution was poured into the container, a silicon wafer was placed horizontally on top of the table, the lid was placed on the container to seal the reaction vessel, and the wafer was left to sit in this state for approximately 12 hours at room temperature, thereby subjecting the wafer to decomposition-sublimation, which left a residue on the table of the mounting stage. The reaction vessel was then opened, the mounting stage containing the residue was removed from the vessel, and a mixed acid produced by mixing HCl and $HNO_3$ in a predetermined ratio was dripped onto the residue at a rate of 1 ml per 1 g of residue, thereby dissolving the residue. The resulting solution containing the dissolved residue was collected in a beaker, and the beaker was heated to 80° C., thereby decomposing and subliming the residue. The small quantity of impurities was recovered using a dilute mixed aqueous solution of HF and $HNO_3$, and the recovered solution was measured using an AAS analysis apparatus (an atomic absorption spectrometry apparatus), thus enabling a quantitative analysis of the Ni content.

As is evident from FIG. 1, the alkali etching liquid of the comparative example 1 containing the added phosphonic acid, and the alkali etching liquid of the comparative example 2 containing the added TTHA produced Ni concentrations of $0.07 \times 10^{10}$ atoms/cm$^2$, indicating a high concentration of Ni at the wafer surface. Furthermore, in the comparative example 3, in which the quantity added of the DTPA was small, a result of $0.5 \times 10^{10}$ atoms/cm$^2$ was obtained, indicating that the Ni contamination reduction effect was inadequate. In the comparative example 4, in which the alkali etching liquid contained only the KOH aqueous solution with no additives, a result of $5 \times 10^{10}$ atoms/cm$^2$ was obtained, indicating that the Ni impurities contained within the KOH aqueous solution were remaining on the wafer surface. In contrast in the case of the alkali etching liquid of the example 1 containing added DTPA, a result of $0.01 \times 10^{10}$ atoms/cm$^2$ was obtained, which represents a satisfactory Ni contamination reduction effect.

As is evident from FIG. 2, in the case of the alkali etching liquid of the comparative example 1 containing the added phosphonic acid, the Ni contamination concentration within the wafer interior following etching was $6.9 \times 10^{11}$ atoms/cm$^3$, indicating that the Ni contamination reduction effect was inadequate. In the case of the alkali etching liquid of the comparative example 2, the Ni contamination concentration was below the detection limit for the apparatus. However, as described above, an alkali etching liquid containing added TTHA still causes a high Ni contamination concentration at the wafer surface, and in addition, TTHA is also more expensive than DTPA, resulting in increased costs. Furthermore, in the comparative example 3) in which although DTPA was added to the KOH aqueous solution, the quantity added was a low 0.02 g/L, the measured Ni contamination concentration was $1.7 \times 10^{12}$ atoms/cm$^3$, in other words, the resulting Ni contamination concentration exceeds $10^{12}$ atoms/cm$^3$, and indicating that even if DTPA is added, if the quantity is insufficient then a satisfactory Ni contamination reduction effect cannot be achieved. In the comparative example 4, in which the alkali etching liquid contained only the KOH aqueous solution with no additives, the resulting Ni contamination concentration exceeded $10^{13}$ atoms/cm$^3$, indicating that the Ni impurities contained within the KOH aqueous solution had diffused into the wafer interior. In contrast in the case of the alkali etching liquid of the example 1, a superior result similar to that of the comparative example 2, below the detection limit of the analysis apparatus, was obtained.

The quantity of DTPA added was increased incrementally from the 0.1 g/L used in the example 1 to 0.5 g/L, 1 g/L, 3 g/L, and 5 g/L respectively, and wafer etching using each of these etching liquids was conducted in the same manner as example 1. The Ni contamination concentration contained within the wafer interior following etching was no more than $1 \times 10^{11}$ atoms/cm$^3$ in each case, the same result as that observed for the example 1. These results confirm that a Ni contamination reduction effect is obtained for quantities of DTPA of 0.1 g/L or greater.

<Comparative Experiment 2>

Figure 3:
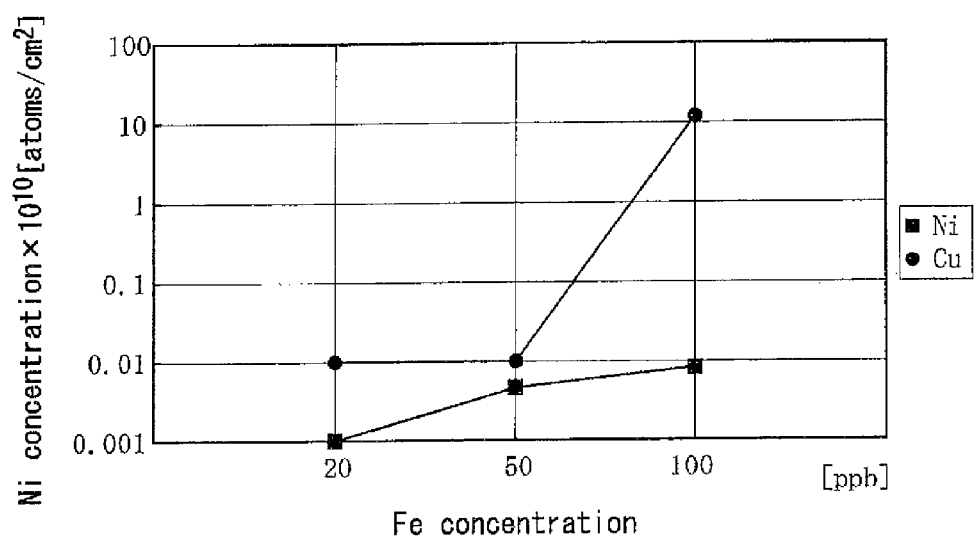
FIG. 3 is a graph showing the Ni contamination concentration and the Cu contamination concentration at the surface of silicon wafers that have been subjected to etching using alkali etching liquids with adjusted levels of Fe concentration.

A 40% by weight aqueous solution of KOH was prepared in the same manner as the example 1, and the Fe concentration within separate samples of this KOH aqueous solution was adjusted to 20 ppb, 50 ppb, and 100 ppb respectively. The thus prepared KOH aqueous solutions each contained 10 ppb of Ni and 10 ppb of Cu. DTPA was added to, and mixed into each of these KOH aqueous solutions in a quantity equivalent to 0.1 g/L, thereby forming a series of alkali etching liquids. Subsequently, six lapped silicon wafers with a resistivity within a range from 0.005 to 0.010 Ω·cm were prepared in the same manner as the comparative experiment 1. Each of the alkali etching liquids with adjusted Fe concentration was then used to conduct etching of two of the silicon wafers. The alkali etched silicon wafers were then measured for Ni contamination concentration and Cu contamination concentration at the wafer surface, as well as for Ni contamination concentration and Cu contamination concentration within the wafer interior, using the same methods as those described for the comparative experiment 1. FIG. 3 shows the results of analyzing the Ni contamination concentration and the Cu contamination concentration at the wafer surface, and FIG. 4 shows the results of analyzing the Ni contamination concentration and the Cu contamination concentration within the wafer interior.

Figure 4:
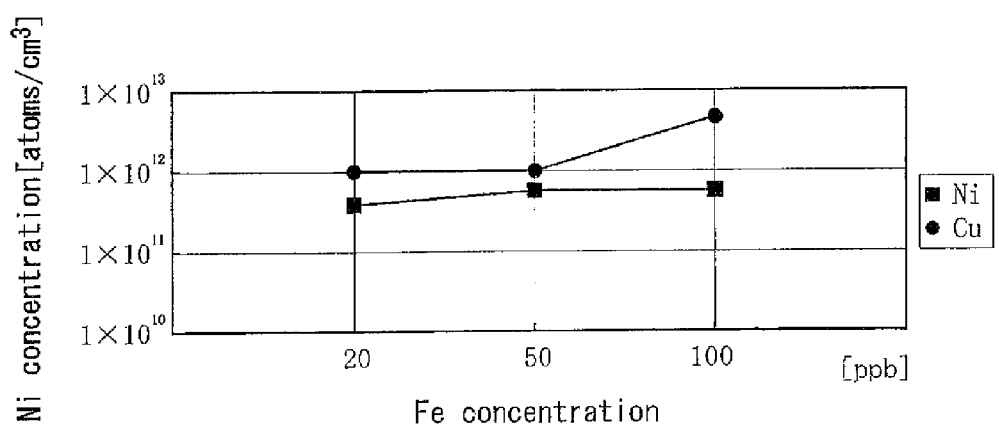
FIG. 4 is a graph showing the Ni contamination concentration and the Cu contamination concentration within the interior of silicon wafers that have been subjected to etching using the alkali etching liquids with adjusted levels of Fe concentration.
Figure 5:
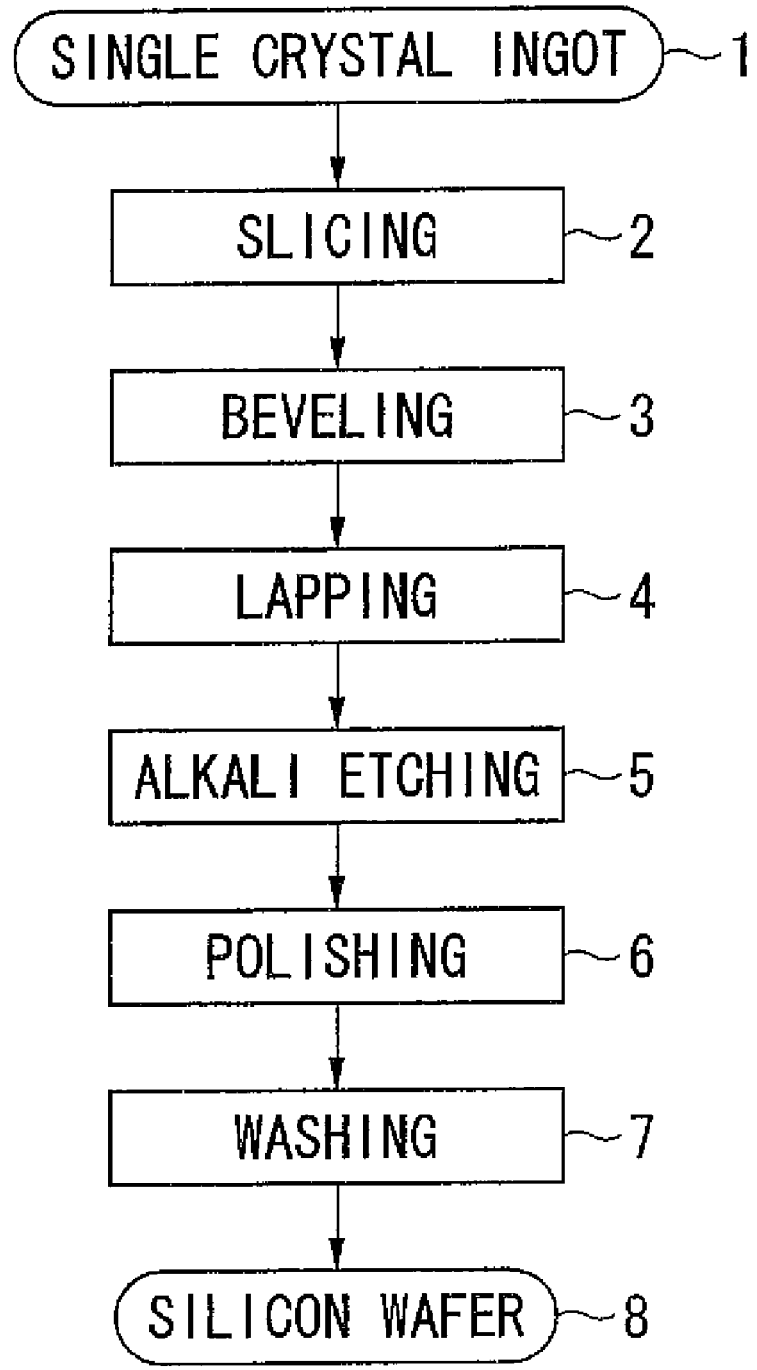
FIG. 5 is a flowchart showing a silicon wafer production process that includes an etching method of the present invention.

As is evident from FIG. 3 and FIG. 4, the Cu contamination concentration increases as the Fe concentration within the KOH aqueous solution increases. Furthermore, as the Fe concentration within the KOH aqueous solution is reduced, the effect of the solution in reducing the diffusion of Ni into the wafer interior is also enhanced.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An alkali etching liquid for a silicon wafer, comprising: an aqueous solution of potassium hydroxide; and diethylene triamine pentaacetic acid at a content of 0.1 g/L, wherein a Fe concentration within said aqueous solution of potassium hydroxide is within a range from 20 to 50 ppb, and a Ni concentration within said aqueous solution of potassium hydroxide is 10 ppb.

2. The alkali etching liquid according to claim 1, wherein the content of said aqueous solution of potassium hydroxide is 40% by weight.

* * * * *